United States Patent [19]

Herrick et al.

[11] Patent Number: 4,845,397
[45] Date of Patent: Jul. 4, 1989

[54] CONSTRAINING MOUNT SYSTEM FOR SURFACE ACOUSTIC WAVE DEVICES

[75] Inventors: Geoffrey C. Herrick, Aloha; Emmanuel Sang, Portland, both of Oreg.

[73] Assignee: Tektronix, Inc., Beaverton, Oreg.

[21] Appl. No.: 842,738

[22] Filed: Mar. 24, 1986

Related U.S. Application Data

[63] Continuation of Ser. No. 683,530, Dec. 19, 1984, abandoned.

[51] Int. Cl.⁴ .................................... H01L 41/08
[52] U.S. Cl. ............................ 310/348; 310/313 R; 310/349
[58] Field of Search ........... 310/313 R, 313 A, 313 B, 310/313 C, 313 D, 348–356

[56] References Cited

U.S. PATENT DOCUMENTS

| | | | |
|---|---|---|---|
| 1,619,854 | 3/1927 | Crossley | 310/349 |
| 1,766,036 | 6/1930 | Crossley | 310/348 |
| 1,882,885 | 10/1932 | Polkinghorn | 310/348 |
| 1,933,601 | 11/1933 | Schiebell | 310/349 |
| 2,029,358 | 2/1936 | Clapp | 310/356 |
| 2,044,145 | 6/1936 | Beard | 310/349 |
| 2,284,088 | 5/1942 | Gerber | 310/349 |
| 2,285,143 | 6/1942 | Bokovoy | 310/349 |
| 2,409,607 | 10/1946 | Bach | 310/348 |
| 2,412,438 | 12/1946 | Bach | 310/349 |
| 2,482,451 | 9/1949 | Adams, Jr. | 310/356 X |
| 3,885,173 | 5/1975 | Lee | 310/313 B |
| 4,034,318 | 7/1977 | Ishiyama et al. | 310/348 UX |
| 4,267,479 | 5/1981 | Kato | 310/348 |
| 4,287,447 | 9/1981 | Skoda et al. | 310/348 |
| 4,291,285 | 9/1981 | Kadota | 310/313 R X |
| 4,314,215 | 2/1982 | Tanji et al. | 310/313 R |
| 4,480,148 | 10/1984 | Archer | 310/313 R X |
| 4,532,451 | 7/1985 | Inoue | 310/348 X |

FOREIGN PATENT DOCUMENTS 0056882  5/1917  Japan ................................ 310/348

Primary Examiner—Mark O. Budd
Attorney, Agent, or Firm—Joseph H. Smith; Francis I. Gray

[57] ABSTRACT

Apparatus is provided for mounting an electronic component having a pressure sensitive active area, which apparatus permits the component to expand and contract with changes in temperature and which does not introduce stresses into the active area of the component. The apparatus includes a cradle which, when attached to a substrate, forms a partial enclosure of the component but which leaves the active area unobscured. A packaging system is also provided wherein the bottom of the cavity of the lower portion of a standard integrated circuit package forms the substrate to be used in conjunction with the cradle for containing the electronic component.

2 Claims, 4 Drawing Sheets

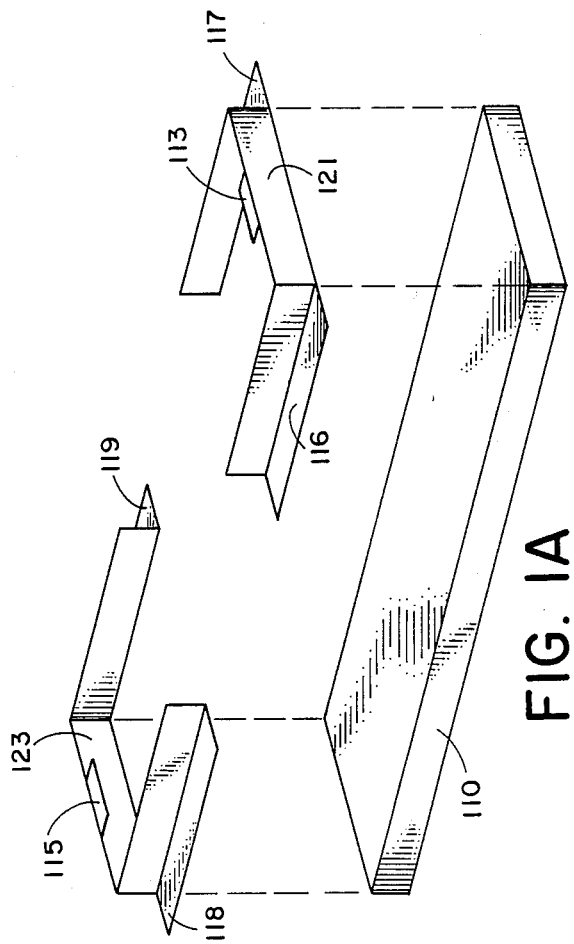
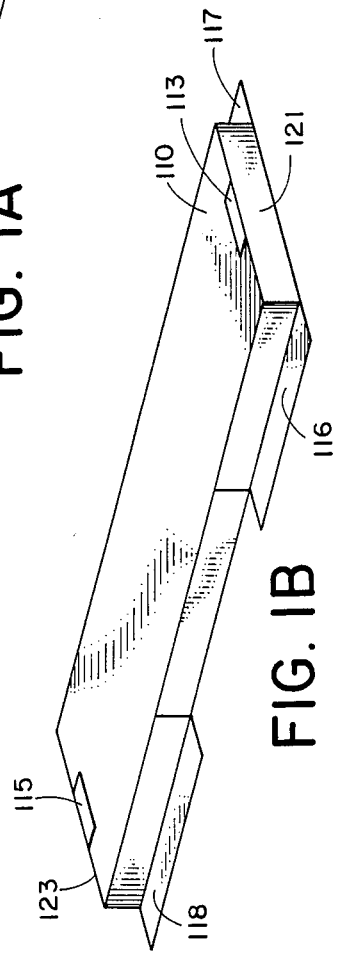

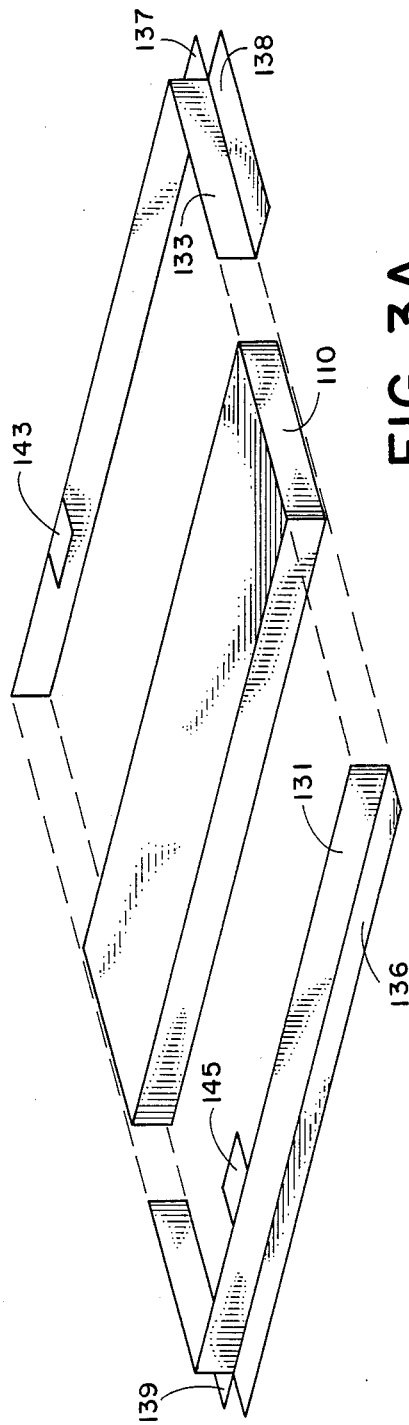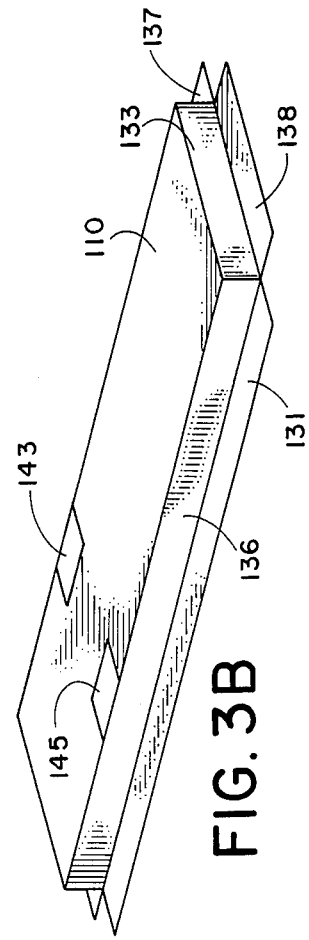

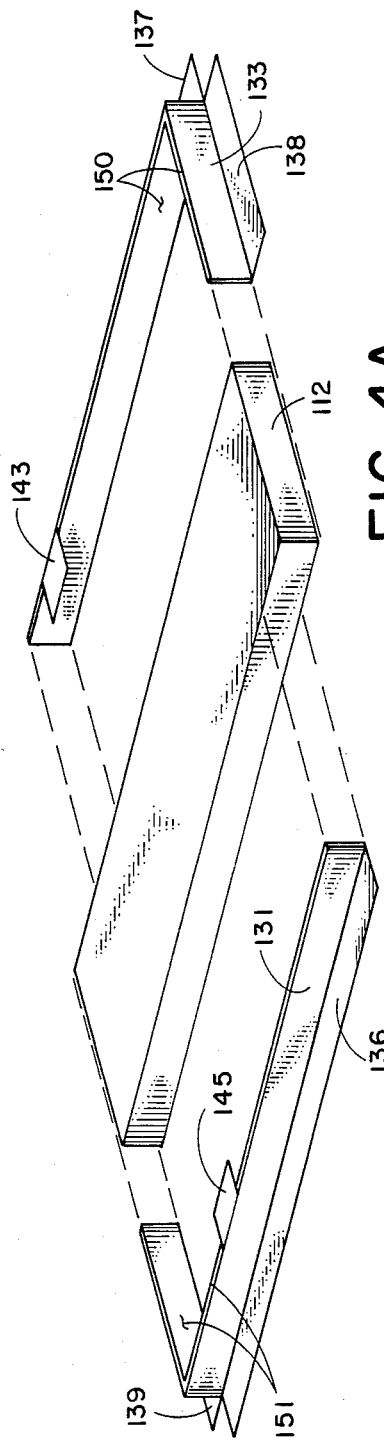
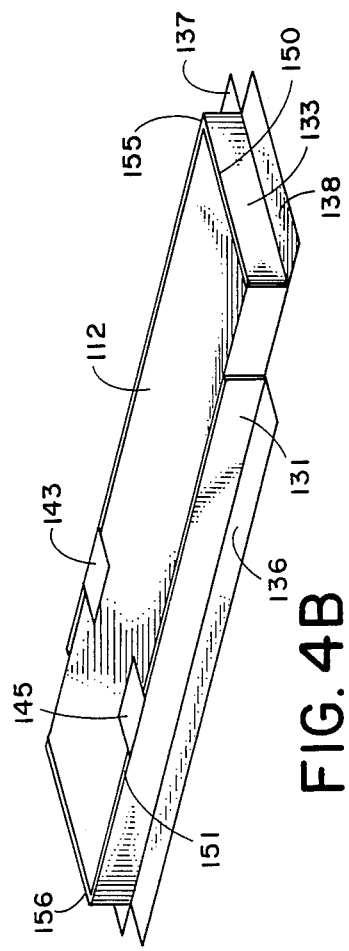

CONSTRAINING MOUNT SYSTEM FOR SURFACE ACOUSTIC WAVE DEVICES

This is a continuation of application Ser. No. 686,530 filed Dec. 19, 1984 and now abandoned.

FIELD OF INVENTION

This invention concerns mounting apparatus and packages for pressure sensitive electronic components, and particularly mounting apparatus for surface acoustic wave (SAW) devices and quartz crystals.

BACKGROUND OF THE INVENTION

Some electronic components are particularly important because of their mechanical properties. For example, surface acoustic wave (SAW) devices have been widely used as intermediate frequency bandpass filters for television receivers, and quartz crystals have seen many applications in watches and other timepieces, and in oscillators generally. Because the mechanical properties in these devices are critical to their operation, their physical attachment to a stable support can be critical as well. For example, some mountings for quartz crystals are spring loaded, and hence exert a force on the edges of the crystals, thereby changing their resonant properties. Similarly, SAW devices are often mounted using end-loaded clamps. Although the clamps are not customarily attached in surface active regions, the fact that they are attached to a firm support in order to mount the device can cause stresses in the active regions of the SAW device. These stresses are due to mismatches in the coefficients of thermal expansion between the SAW device and the clamp mounting, especially during processing. Silicon mounting adhesives such as RTV have also been used to mount SAW devices. Although these adhesives somewhat reduce the stresses encountered, they are known to outgas under high vacuum conditions and can contaminate the surface of the SAW device.

What is needed is a mounting system which does not introduce stresses, either thermal or mechanicals into these pressure sensitive devices, and which does not contribute to surface contamination from outgassing of adhesives.

SUMMARY OF THE INVENTION

In accordance with the illustrated preferred embodiments, the present invention provides apparatus for mounting an electronic component having a pressure sensitive active area, which permits the component to expand and contract with changes in temperature and which does not introduce stresses into the active area of the component. The apparatus includes a cradle which, when attached to a substrate, forms a partial enclosure for the component but which leaves its active area unobscured. The cradle is configured to have internal dimensions close to but slightly larger than the external dimensions of the component in order to constrain translational motion of the component without attaching the component to the substrate. At the same time the cradle is large enough not to introduce undesired stresses into the active area of the component.

A packaging system is also provided wherein the bottom of the cavity of the lower portion of a standard integrated circuit package forms the substrate to be used in conjunction with the cradle for containing the electronic component.

BRIEF DESCRIPTION OF THE DRAWINGS

FIG. 1A shows a first embodiment of the invention illustrating its general configuration relative to a pressure sensitive electronic component.

FIG. 1B shows the first embodiment of the invention fitted onto the component illustrated in FIG. 1A.

FIG. 3A shows a second embodiment of the invention illustrating its general configuration relative to a pressure sensitive electronic component.

FIG. 3B shows the second embodiment fitted onto the component illustrated in FIG. 3A.

FIG. 4A shows a third embodiment of the invention illustrating its general configuration relative to a pressure sensitive electronic component.

FIG. 4B shows the third embodiment fitted onto the component illustrated in FIG. 4A.

DETAILED DESCRIPTION OF THE INVENTION

Figure 2:
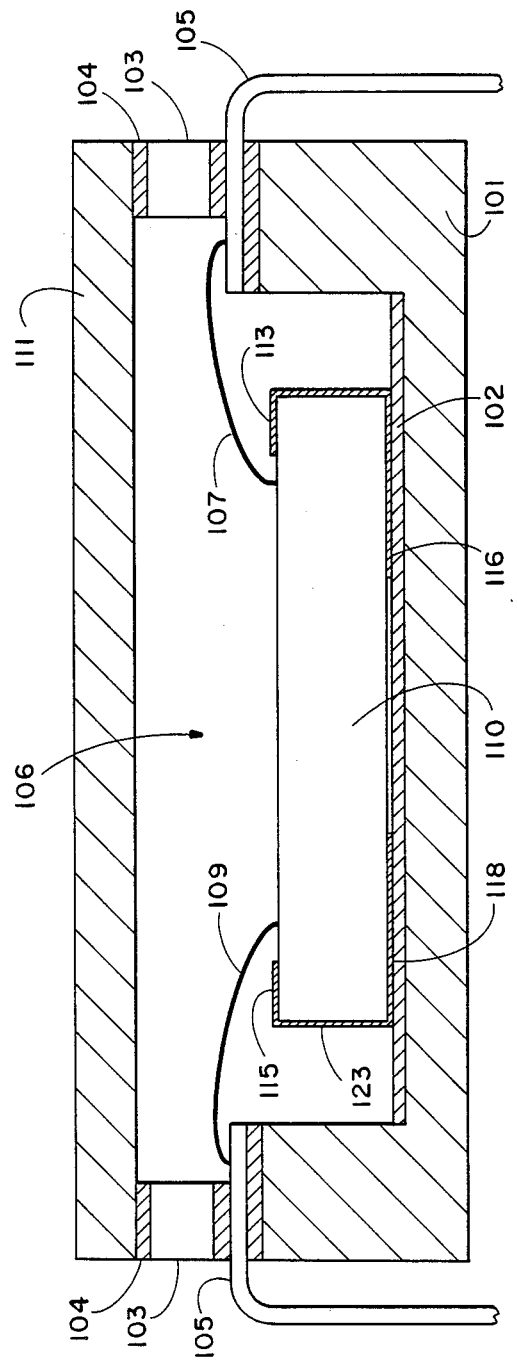
FIG. 2 shows a completed package using the first embodiment of the invention.

As shown in FIG. 1A there is a cradle, including U-shaped end pieces 121 and 123, for holding a pressure sensitive electronic component such as a SAW device 110. To construct the cradle, end pieces 121 and 123 are first photopatterned on metal sheet stock, such as beryllium-copper. The patterned sheet stock is then precision etched and plated with a protective material, e.g., satin-nickel, from which the end pieces 121 and 123 are then formed into the shape shown in FIG. 1A. In order to hold SAW device 110, the dimensions of end pieces 121 and 123 are kept very close to, but slightly larger than, the dimensions of the SAW device they are to hold. The end pieces then can be easily fit over the ends of the SAW device as in FIG. 1B.

To hold the SAW device in a fixed location, end pieces 121 and 123 have flanges 116 and 117, and 118 and 119, respectively, which are used to weld the cradle to the bottom of a package cavity 106 as is illustrated in FIG. 2. Also, tabs 113 and 115 serve to hold the SAW device in place vertically when the cradle is welded to the bottom of the cavity. As shown in FIG. 2, a standard dual-in-line package is made up of a base 101 having a cavity 106 with a gold-plated attachment pad 102 therein, and a metal leadframe 105 sealed to the base 101 and to a spacer 103. In most such packages, base 101 is generally a ceramic or metallic material, however, in this embodiment ceramic is preferred, especially alumina, since it has a coefficient of thermal expansion close to that of the quartz used for the SAW device. Such an alumina package can be obtained from Kyocera, Inc., part number KD-75337-C. Flanges 116, 117, 118, and 119 are welded to attachment pad 102 using standard techniques. Wire or ribbon leads 109 and 107 are then attached between the SAW device 110 and the lead frame 105 using well known bonding techniques. A cap 111 is then sealed to spacer 103 to form an hermetic enclosure for the SAW device. Although other configurations can be used, cap 111 in the preferred construction is Kovar-plated and includes a preformed solder seal 104, typically 80% gold, 20% tin. Also the bonding surface of spacer 103 is typically gold plated. With this configuration, the attachment of the cap to the spacer is effected by placing them in contact and heating to the melting temperature of the solder in a vacuum, or in an inert atmosphere such as nitrogen or helium. An example of such a cap 111 can be obtained from Semi-Alloys, Inc., part number C376-21-5OM-S.

Dimensions for SAW device 110 are relatively standard in the art, generally in the range of 4 mm to 20 mm long by 2 mm to 4 mm wide by 0.4 to 1 mm thick, depending on the desired resonant frequency. In this embodiment the vertical dimension of end pieces 121 and 123 is nominally about 25 microns larger than the thickness of SAW device 110, and similarly the width of the end pieces is about 25 microns larger than the width of the SAW device. Also, the end gap is generally kept to about 25 microns. This nominal clearance of 25 microns around the perimeter and vertically is not critical and can be significantly larger. The principal constraints are that the SAW device should have adequate clearance for thermal expansion during processing and that movement should be constrained sufficiently to avoid damage to the lead attachments. Although a clearance of 25 microns is preferred, a clearance as large as 100 microns has been used around the perimeter under experimental conditions. Also, it has been found that often the SAW device will be lodged against one side of the cradle without significantly affecting its performance. In that situation, using the nominal construction, the clearance on the opposite side is 50 microns.

It should also be noted that the size of tabs 113 and 115 are kept small, generally extending over the edge of the SAW device only as much as is necessary to hold the device in place. In this particular embodiment tabs 113 and 115 extend over the SAW device no more than about 0.4 mm. The small tab size helps to insure that the upper surface of the SAW device will remain largely unobscured in order to provide maximum flexibility for lead attachment locations, and to avoid interference with the active areas of the device. In order to better secure larger devices, it may be preferable to extend the width of the tabs by 100 to 200 microns, or even more, if this can be accomplished without sacrificing a significant amount of active area.

Another embodiment is shown in FIGS. 3A and 3B. Here instead of two U-shaped end pieces, the cradle includes two L-shaped pieces 131 and 133, each covering one end and one side of SAW device 110. In this embodiment, welding flanges 136, 137, 138, and 139 extend around the entire perimeter of the SAW device, and therefore permit a stronger bond to the attachment pad 102 of the package than is available in the first embodiment. Also, it can accommodate SAW devices which are longer or wider than the L-shaped cradle, since the cradle need not completely surround the SAW device. Thus, this second embodiment is particularly well suited for larger SAW devices, and forms a more universal structure. In addition, tabs 143 and 145 are shown located on the sides of the SAW device 110 rather than on the ends as in FIGS. 1A and 1B. This is to illustrate the principle that the location of the tabs is highly variable and depends on the configuration of the active area of the SAW device. Generally, the tabs are positioned to avoid interference with the active area. In this particular embodiment, the clearances between the SAW device and the cradle are substantially the same as those of the first embodiment and the general method of construction is also substantially the same.

The advantages of both of the above embodiments of the present invention are several. First, the pressure sensitive electronic component is not physically bonded to the restraining system and is free to expand and contract with changes in temperature. Additionally, because the component is not bonded in place, no stresses are introduced into the active area due to temperature excursions during processing. Also, the fact that no adhesives are used significantly reduces outgassing in high vacuum operations and during processing, thus curtailing surface contamination of the pressure sensitive component. The result is stable, repeatable performance, and long-term stability for the component.

In FIGS. 4A and 4B is another embodiment of the invention implemented for illustration purposes with a SAW device 112 which is longer in extent than the L-shaped shaped pieces 131 and 133. In this embodiment spacers 150 and 151 are placed between the L-shaped pieces and the SAW device to eliminate the gap described in the previous embodiments. Spacers 150 and 151 can be made of Teflon or some other relatively stable material which can act as a soft constraint to hold the SAW device in place in the cradle. The concept is to constrain the device in a secure mount which exerts only minimal pressure on the SAW device. In the preferred mode, the spacers 150 and 151 traverse the entire length and width of L-shaped pieces 133 an 131 respectively, and range in thickness from about 25 microns to about 125 microns. The motivation for this embodiment is that in practice it can be difficult to obtain the nominal spacing of 25 microns around the perimeter of the SAW device as described in the previous embodiments, especially for large devices. As a result somewhat larger spacings, for example in the range of 50 to 75 microns, can and do occur. These larger spacings in particular, and sometimes even the smaller spacings, can lead to undesirable microphonic resonances and phase noise in the output signal from the SAW device. The Teflon spacers 150 and 151, by filling the gap, substantially eliminate these problems.

Another embodiment can also be illustrated using FIGS. 4A and 4B. Instead of using Teflon for spacers 150 and 151 which extend along the L-shaped pieces, a few drops of a low vapor pressure epoxy can be used at the corner of each L-shaped piece to serve as spacers, i.e., at corners 156 and 155. (Two to five drops are generally sufficient). Such an epoxy is EPOTEK H-72. In the preferred mode, only a minimal amount of epoxy is used to reduce later processing difficulties which are attendant to the use of any adhesive. Generally, the epoxy extends along the sides and width of the L-shaped pieces only 250 to 400 microns, with a thickness in the range of about 25 to 125 microns.

The actual volume of epoxy can vary considerably depending on the particular size of the SAW device, but the concept is to use as little epoxy as is necessary to pin the opposite corners 155 and 156 of the SAW device into the cradle in order to ameliorate microphonics and phase noise often associated with a substantially unconstrained package as illustrated in FIGS. 3A and 3B.

While the preferred embodiments of the present invention have been shown and described, it will be apparent to those skilled in the art that many changes and modifications may be made without departing from the invention in its broader respects. For example, the cradle could be manufactured as one piece which extends around the perimeter of the pressure sensitive component. Also, other devices, particularly oscillators, might be packaged along with the pressure sensitive component in the same hermetic enclosure. In addition, the cradle can be used to constrain the motion of pressure sensitive components other than SAW devices, for example, it could also be used for quartz crystals. Therefore, the appended claims are intended to cover all such modifications, changes and applications that fall within the true spirit and scope of the invention.

What is claimed is:

1. An electronic apparatus comprising:
   a base having a cavity therein;
   an electronic component in the shape of a rectangular parallelepiped in contact with the bottom of said cavity, said component having a pressure sensitive active area; and
   cradle means attached to said bottom for constraining translational motion of said component, said cradle means forming a partial enclosure of said component without contacting said component while leaving said active area unobscured, said cradle means comprising two L-shaped pieces, each configured to fit on one corner of said ractangular parallelepiped.

2. An apparatus as in claim 1 further comprising spacer means between said component and said L-shaped pieces for maintaining a fixed separation between said component and said cradle means.

* * * * *